United States Patent [19]

Kasahara

[11] Patent Number: 5,225,708
[45] Date of Patent: Jul. 6, 1993

[54] SEMICONDUCTOR JUNCTION CAPACITANCE ELEMENT WITH BREAKDOWN VOLTAGE PROTECTION

[75] Inventor: Takeshi Kasahara, Tsurugashima, Japan

[73] Assignee: Toko, Inc., Tokyo, Japan

[21] Appl. No.: 971,934

[22] Filed: Nov. 5, 1992

[30] Foreign Application Priority Data

Nov. 13, 1991 [JP] Japan ................................. 3-325227

[51] Int. Cl.⁵ ............................................ H01L 29/92
[52] U.S. Cl. ..................................... 257/595; 257/487
[58] Field of Search ........................ 257/595–597, 257/487, 494, 532

[56] References Cited

U.S. PATENT DOCUMENTS 4,475,117 10/1984 Raabe ................................. 257/597

Primary Examiner—Gene M. Munson

[57] ABSTRACT

An semiconductor junction capacitance element equipped with the function of preventing electrostatic breakdown is disclosed in which a main PN junction adapted to serve as variable capacitance diode is defined in an epitaxial layer of a first conductivity type. A diffusion layer of the first conductivity type is provided in the epitaxial layer at a position spaced apart from a lateral PN junction which is exposed at major surface of the epitaxial layer so that the breakdown voltage of the lateral PN junction is set up to be lower than the breakdown voltage of the main PN junction by virtue of the provision of the diffusion layer.

4 Claims, 2 Drawing Sheets

SEMICONDUCTOR JUNCTION CAPACITANCE ELEMENT WITH BREAKDOWN VOLTAGE PROTECTION

BACKGROUND OF THE INVENTION

1. Field of the Invention

The present invention relates to a semiconductor junction capacitance element such as variable capacitance diode or the like which is resistant to electrostatic breakdown.

2. Description of the Prior Art

Generally, among methods of preventing electrostatic breakdown of a semiconductor device are a method in which waveform of surge voltage resulting from static electricity is smoothed out by means of a time constant defined by a capacitor and resistor, thereby preventing an abnormally high potential from being applied to the internal circuit of the semiconductor device, a method in which a protective diode is employed, and a method in which a discharge tube is utilized. Commonly, a diode can readily be mounted onto a printed circuit board or incorporated in the semiconductor device, and thus has widely been employed for the purpose of preventing electrostatic breakdown of a semiconductor device.

Referring to FIG. 1 of the accompanying drawings, there is shown, in cross-section, an example of the prior-art semiconductor device incorporating diodes for preventing electrostatic breakdown. In FIG. 1, a semiconductor substrate 1 comprises a semiconductor substrate 2 of the $N^{--}$ conductivity type (lower resistivity) and an epitaxial layer 3 of the $N^-$ conductivity type (higher resistivity). In the epitaxial layer 3, there are provided diffusion layers 5 and 7 of the $N^-$ conductivity type (low resistivity) and P conductivity type diffusion layers 6 and 8 which overlie the diffusion layers 5 and 7 respectively in such a manner as to define PN junctions $J_1$ and $J_2$ which constitute a variable capacitance diode and a diode for preventing electrostatic breakdown respectively. A conductive film 9 is provided on the main surface of the diffusion layers 6 and 8. Indicated at 4 is a silicon dioxide film. The PN junction $J_2$ defined by the $N^-$ conductivity type diffusion layer 7 and the P conductivity type diffusion layer 8 is so established as to have a lower breakdown voltage than the PN junction $J_1$. If a surge voltage or the like is applied to the conductive film 9, then discharge will be caused to occur through the protection diode $J_2$ for preventing electrostatic breakdown so that the PN junction $J_1$ will be prevented from electrostatic breakdown.

However, the conventional semiconductor junction capacitance element is disadvantageous in that in the case where a protection diode is connected in parallel therewith to prevent electrostatic breakdown, the junction capacitance of the protection diode is added to the capacitance of the semiconductor junction capacitance element which is dominant, so that the dominant capacitance is changed, and thus such a diode cannot be used when it is attempted to achieve precise junction capacitance.

A variable capacitance diode for UHF, for example, has capacitance of several pF, so that when a protection diode is connected in parallel therewith, the junction capacitance of the protection diode turns out not to be negligible and thus no diode can be employed for the purpose of preventing electrostatic breakdown.

Another method of preventing electrostatic breakdown for such an application is to mount a discharge tube onto a printed circuit board to thereby protect the internal circuit from surge voltage. Disadvantageously, however, the discharge tube is expensive and bulky. Another disadvantage is that from the standpoint of its life span, the discharge tube is unsuitable for portable communication devices.

SUMMARY OF THE INVENTION

Accordingly, it is an object of the present invention to provide a semiconductor junction capacitance element which is so designed as to be free from the above-mentioned disadvantages of the prior art.

Briefly stated, according to the present invention, there is provided a semiconductor junction capacitance element wherein an epitaxial layer is formed with diffusion layer which has the same conductivity type as that of the epitaxial layer and a relatively high impurity concentration so that the the breakdown voltage of the lateral PN junction is established to be lower than that of the main PN junction, thereby preventing abnormally high voltage from being applied to the main PN junction. In this way, according to the present invention, it is possible to achieve a semiconductor junction capacitance element of a highly simplified construction which is adapted for preventing electrostatic breakdown, without using any diode for preventing electrostatic breakdown.

Further, the semiconductor junction capacitance element according to the present invention is so designed as to be resistant to electrostatic breakdown and can be formed in a small size, and thus can be most effectively used as a variable tuning capacitance element for portable communication devices or the like.

Still further, the semiconductor junction capacitance element according to the present invention can be formed by a normal diffusion process and thus can readily be incorporated in a semiconductor device. In this way, according to the present invention, there is advantageously be provided an inexpensive semiconductor junction capacitance element.

Other objects, features and advantages of the present invention will become apparent from the ensuing description taken in conjunction with the accompanying drawings.

DESCRIPTION OF THE PREFERRED EMBODIMENTS

Figure 1:
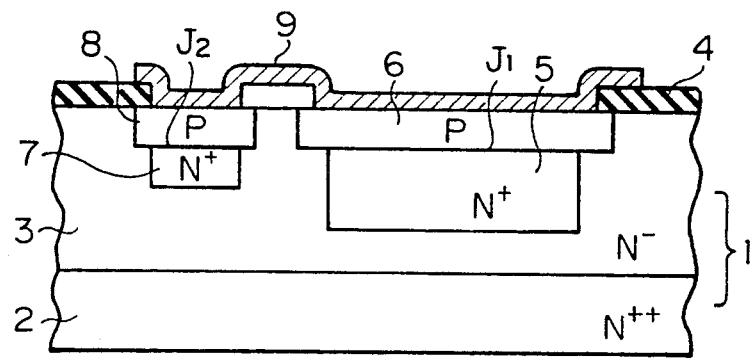
FIG. 1 is a sectional view showing an example of prior-art semiconductor junction capacitance element.
Figure 2:
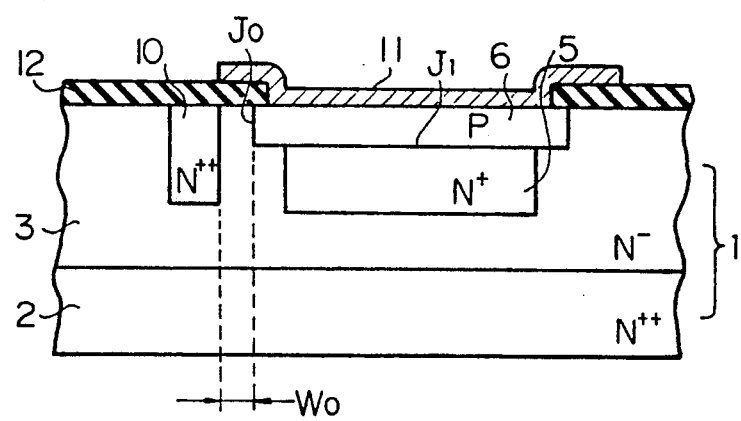
FIG. 2 is a sectional view showing the semiconductor junction capacitance element according to an embodiment of the present invention.

FIG. 2 is a sectional view showing an example of the semiconductor junction capacitance element according to the present invention, which includes a semiconductor substrate 1 comprising an $N^{++}$ conductivity type semiconductor substrate 2 having an $N^-$ conductivity type epitaxial layer 3 formed therein. The epitaxial layer 3 is provided with an $N^+$ conductivity type diffusion layer 5 and N⁻⁻ conductivity type diffusion layer 10. Further, a diffusion layer 6 of the P conductivity type is provided in such a manner as to cover the N⁻ conductivity type diffusion layer 5 so that the main PN junction $J_1$ is defined therebetween. A lateral PN junction $J_0$ is defined between the diffusion layer 6 and epitaxial layer 3; a silicon dioxide film 12 is provided covering that portion of the PN junction $J_0$ which is exposed at the major surface of the epitaxial layer 3; and a conductive film 11 is provided on the major surface of the diffusion layer 6. A diffusion layer 10 is provided at a predetermined distance $W_0$ from PN junction $J_0$. This diffusion layer 10 can be formed by means of an ion implantation process in such a manner that the position and impurity concentration of the diffusion layer are precisely controlled.

Figure 3:
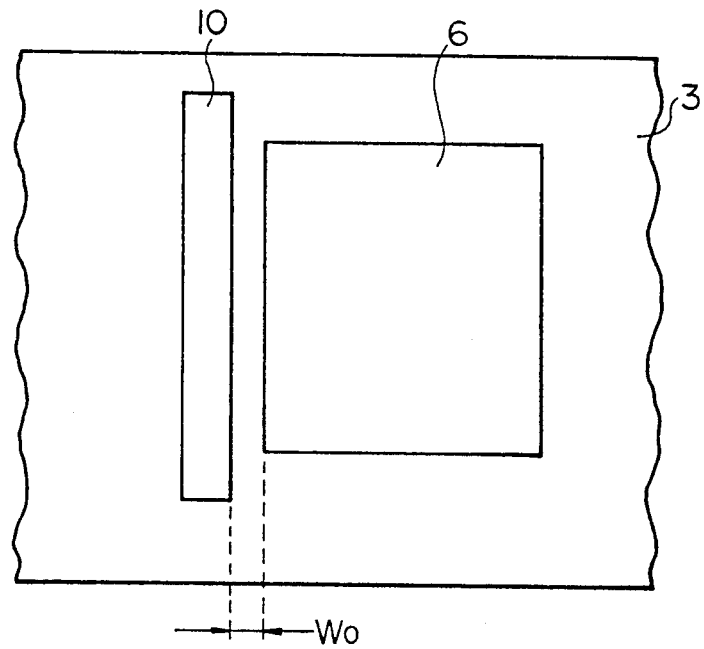
FIG. 3 is a plan view of the embodiment shown in FIG. 2.

FIG. 3 is a plan view of the above-mentioned embodiment of the present invention, wherein the silicon dioxide film 12 and conductive film 11.

Description will now be made of the case where a surge voltage is applied to the above-mentioned semiconductor junction capacitance element. If an abnormal voltage is applied to the PN junctions $J_0$ and $J_1$, then a depletion layer extending from the lateral PN junction $J_0$ is caused to come into contact with the diffusion layer 10 and thus is subjected to breakdown, before depletion layer of the main PN junction $J_1$ reaches the semiconductor substrate 2. Since the breakdown voltage of the PN junction $J_0$ is set up to be lower than that of the PN junction $J_1$, even if a surge voltage or the like which results from static electricity is imparted to the conductive film 9, breakdown of the PN junction $J_0$ is caused to occur at a relatively low voltage so that the main PN junction $J_1$ is protected from electrostatic breakdown.

The semiconductor junction capacitance element for preventing electrostatic breakdown will be described below. One of the causes for influencing electrostatic breakdown of a semiconductor device depends on the level of breakdown voltage of the PN junction of the semiconductor device. The "breakdown voltage" refers to a voltage at which a breakdown phenomenon is caused to occur due to electron avalanche when field intensity reaches a critical level EC and current flowing the PN junction is increased abruptly. It is known that the following relationship holds true between the breakdown voltage of PN junction and the critical level EC at a room temperature:

$$EC = V_{BR}/W_{01} \simeq 30 \ (V/\mu m) \qquad (1)$$

where $V_{BR}$ is the breakdown voltage, and $W_{01}$ is the width of depletion layer.

Equation (1) represents a value which was theoretically obtained, and with an actual semiconductor element, it represents the critical value EC multiplied by a constant K. Normally, the value of the constant K is about 0.15, depending on the material or the like of the semiconductor substrate.

The breakdown voltage $V_{BR}$ and electrostatic breakdown strength are in an inversely proportional relationship with each other; the higher the breakdown voltage $V_{BR}$ of PN junction, the lower the electrostatic breakdown strength.

With a certain type of semiconductor junction capacitance element, there is the tendency that the electrostatic breakdown strength thereof is extremely lowered when it is attempted to achieve the required characteristics. To cope with such a tendency, as shown in FIG. 2, the diffusion layer 10 is provided in the epitaxial layer 3 at the predetermined distance of $W_0$ from the PN junction $J_0$, so that the spreading of the depletion layer which extends laterally from the PN junction $J_0$ is restrained, thereby causing the PN junction $J_0$ to be subjected to breakdown. In this way, the semiconductor junction capacitance element is made to be resistant to electrostatic breakdown. With a variable capacitance diode for UHF, the junction capacitance thereof becomes as high as several pF, and the breakdown voltage thereof reaches about 110 volts, thus resulting in the electrostatic breakdown strength being lowered. By setting at 15 μm the distance $W_0$ of the diffusion layer 10 from the lateral PN junction $J_0$ of the semiconductor junction capacitance element, and by substituting the value of $W_0$ for $W_{01}$ in the equation (1), the breakdown voltage of the PN junction $J_0$ is given as follows:

$$V_{BR} = W_0 \times 30 \times K = 15 \times 30 \times 0.15 = 68(V) \qquad (2).$$

As mentioned above, the breakdown voltage $V_1$ of the main PN junction $J_1$ is about 110 volts, whereas the breakdown voltage $V_0$ of the lateral PN junction $J_0$ is as low as 68 volts. Thus, even if an abnormal voltage such as surge voltage or the like is imparted to this element, the lateral PN junction $J_0$ is subjected to breakdown first so that the abnormal voltage is prevented from being applied to the main PN junction $J_1$ so that the latter is protected from electrostatic breakdown.

By setting up the relationship between the breakdown voltages $V_1$ and $V_0$ of the PN junctions J1 and J0 such that $V_1 > V_0$, it is possible to protect the main PN junction $J_1$ from electrostatic breakdown. Thus, in the case where the breakdown voltage $V_1$ of the main PN junction $J_1$ is about 110 volts, it is possible to achieve sufficient electrostatic breakdown preventing function even if the breakdown voltage $V_0$ of the lateral PN junction $J_0$ is set at about 80 volts.

Figure 4:
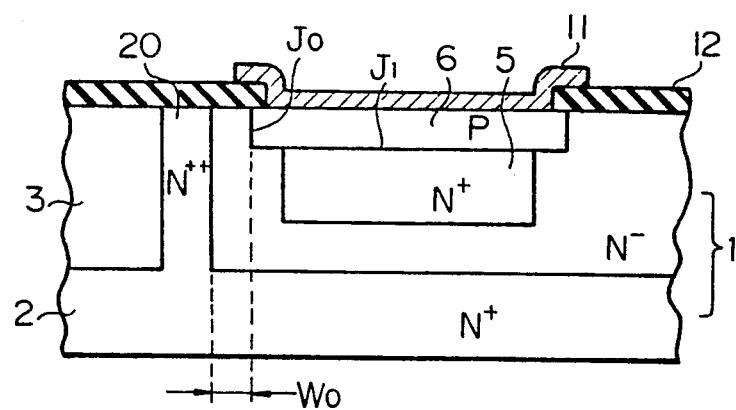
FIG. 4 is a sectional view showing the semiconductor junction capacitance element according to another embodiment of the present invention.

Referring to FIG. 4, there is shown the semiconductor junction capacitance element according to another embodiment of the present invention, which is similar to the embodiment of FIG. 2, except that unlike the diffusion layer 10 of FIG. 2, a diffusion layer 20 extends to reach a semiconductor substrate 2. Further description of the construction of this embodiment will be omitted.

With this embodiment, too, the breakdown voltage of the lateral PN junction $J_0$ is set up to be lower than the breakdown voltage of the main PN junction $J_1$ so that the lateral PN junction J0 will be subjected to breakdown earlier than the main PN junction J1; thus, the semiconductor junction capacitance element according to this embodiment can also be made to be highly resistant to surge voltage resulting from static electricity.

It is also possible that the diffusion layers 10 and 20 may be provided in such a manner to surround the diffusion layer 6.

While the present invention has been illustrated and described with respect to specific embodiments, it is to be understood that the present invention is by no means limited thereto but encompasses all changes and modifications which will become possible without departing from the spirit and scope of the present invention.

I claim:

1. A semiconductor junction capacitance element comprising an epitaxial layer of a first conductivity type in which a main junction adapted to serve as a variable capacitance element is defined; and a diffusion layer of the first conductivity type, said diffusion layer being spaced apart from a lateral junction extending from said main junction and exposed at major surface of said epitaxial layer, wherein with the aid of said diffusion layer, breakdown voltage of said lateral junction is set up to be lower than breakdown voltage of said main junction.

2. A semiconductor junction capacitance element according to claim 1, wherein said first conductivity type diffusion layer provided at a position spaced apart from said lateral junction extends through said epitaxial layer to reach semiconductor substrate.

3. A semiconductor junction capacitance element according to claim 1, wherein said variable capacitance diode is constructed such that the distance of said lateral junction to said diffusion layer is 15 μm or less.

4. A semiconductor junction capacitance element according to claim 1, wherein the breakdown voltage of said lateral junction is set at 80 volts or less.

* * * * *